United States Patent [19]
French

[11] Patent Number: 6,135,875
[45] Date of Patent: Oct. 24, 2000

[54] ELECTRICAL CABINET

[75] Inventor: F. William French, Littleton, Mass.

[73] Assignee: EMC Corporation, Hopkinton, Mass.

[21] Appl. No.: 09/343,000

[22] Filed: Jun. 29, 1999

[51] Int. Cl.[7] .................................................. H05K 5/00
[52] U.S. Cl. .......................................... 454/184; 361/695
[58] Field of Search .................................. 454/184, 187; 361/687, 695

[56] References Cited

U.S. PATENT DOCUMENTS

| | | | |
|---|---|---|---|
| 4,568,243 | 2/1986 | Schubert et al. | 415/213 |
| 5,793,610 | 8/1998 | Schmitt et al. | 361/695 |
| 5,890,959 | 4/1999 | Pettit et al. | 454/184 |
| 6,031,717 | 2/2000 | Baddour et al. | 361/687 |

*Primary Examiner*—Harold Joyce
*Assistant Examiner*—Michelle A Mattera
*Attorney, Agent, or Firm*—Fish & Richardson P.C.

[57] ABSTRACT

A cabinet having an aperture passing through a surface thereof. A fan is mounted over the aperture in the cabinet. The fan is adapted to produce a flow of air through the interior of the cabinet when operating properly to exhaust such flow of air externally of the cabinet. A resilient membrane is mounted to said surface of said cabinet. The resilient membrane has formed therein: a plurality of slits extending radially from a center of a region of the membrane. The slits are spaced about the periphery of the aperture to form a plurality of flaps in the membrane. The flaps are configured to pivot from a nominal position outwardly from the surface of the cabinet from the flow of air produced by the fan when the fan is operating properly and to return to the nominal position when the fan is operating improperly to inhibit air externally of the cabinet from entering into the interior. The fans have a hub and a grate. The membrane has an aperture formed therein. The aperture is at the center of the region. The aperture in the membrane is disposed over the hub and the flaps are disposed over the grate when the fan is operating improperly. With such an arrangement, the mass momentum of the air causes the flap (i.e., a check valve) material to deflect outward and open a path for the air to escape. The air can continue to exhaust from the fan while the fan is operating; but, if the fan fails and stops operating, the flap will collapse and seal over the aperture thereby inhibiting air leakage into the cabinet. Further, the flap also serves as a visual indicator, by its "closed" position, to indicate whether or not the fan is operating.

2 Claims, 4 Drawing Sheets

ELECTRICAL CABINET

BACKGROUND OF THE INVENTION

This invention relates generally to electrical cabinets and more particularly to cooling systems used cool electrical components stored in such cabinets.

As is known in the art, air is typically used to cool electrical components stored in electrical cabinets. One technique used for such cooling is to provide apertures through the top of a cabinet. Fans are mounted in registration with the apertures to create an air flow which passes over the electrical components. However, if one of the fans fails to operate properly, air external of the cabinet can re-circulate into the interior of the cabinet. The re-circulating air may cause the failed fan to "backdrive" (spin backwards) and give a visual appearance of operating (spinning). In some cases, the speed of the fan backdriving can exceed a tachometer alarm output speed, causing the fan alarm signal to appear normal. Some fans with low horsepower motors will continue to backdrive after a temporary power failure or a hot swap of the fan module, because the fan motors are unable to overcome the backdriving torque caused by the in-rushing air momentum re-circulating through the fan.

Re-circulating air through the failed fan or "short circuiting" can provide a path of least resistance to the adjacent fans and thus lower the cabinet airflow impedance. This in turn lowers the operating point (pressure/volume relationship) of the fans and causes less pressure to be generated and less air volume through the cabinet. Areas of high impedance in the cabinet are most effected in terms of airflow reduction. The loss in cabinet pressure and airflow contribute to less cooling and higher component temperatures which can accelerate component failure.

SUMMARY OF THE INVENTION

In accordance with the present invention, a cabinet is provided having an aperture passing through a surface thereof. A fan is mounted over the aperture in the cabinet. The fan is adapted to produce a flow of air through the interior of the cabinet when operating properly to exhaust such flow of air externally of the cabinet. A resilient membrane is mounted to said surface of said cabinet. The resilient membrane has formed therein: a plurality of slits extending radially from a center of a region of the membrane. The slits are spaced about the periphery of the aperture to form a plurality of flaps in the membrane. The flaps are configured to pivot from a nominal position outwardly from the surface of the cabinet from the flow of air produced by the fan when the fan is operating properly and to return to the nominal position when the fan is operating improperly to inhibit air externally of the cabinet from entering into the interior. The fans have a hub and a grate. The membrane has an aperture formed therein. The aperture is at the center of the region. The aperture in the membrane is disposed over the hub and the flaps are disposed over the grate when the fan is operating improperly. With such an arrangement, the mass momentum of the air causes the flap (i.e., a check valve) material to deflect outward and open a path for the air to escape. The air can continue to exhaust from the fan while the fan is operating; but, if the fan fails and stops operating, the flap will collapse and seal over the aperture thereby inhibiting air leakage into the cabinet. Further, the flap also serves as a visual indicator, by its "closed" position, to indicate whether or not the fan is operating.

In accordance with another feature of the invention, a check valve is provided. The valve comprise: a resilient flexible membrane having an circular aperture formed therethrough. The membrane has a plurality of slits formed therein, such extending radially from the center of the aperture and terminating in the periphery of the aperture to provide a plurality of flaps in the membrane.

BRIEF DESCRIPTION OF THE DRAWING

These and other features of the invention will become more readily apparent from the following detailed description when read together with the accompanying drawings, in which.

DESCRIPTION OF THE PREFERRED EMBODIMENTS

Figure 1:
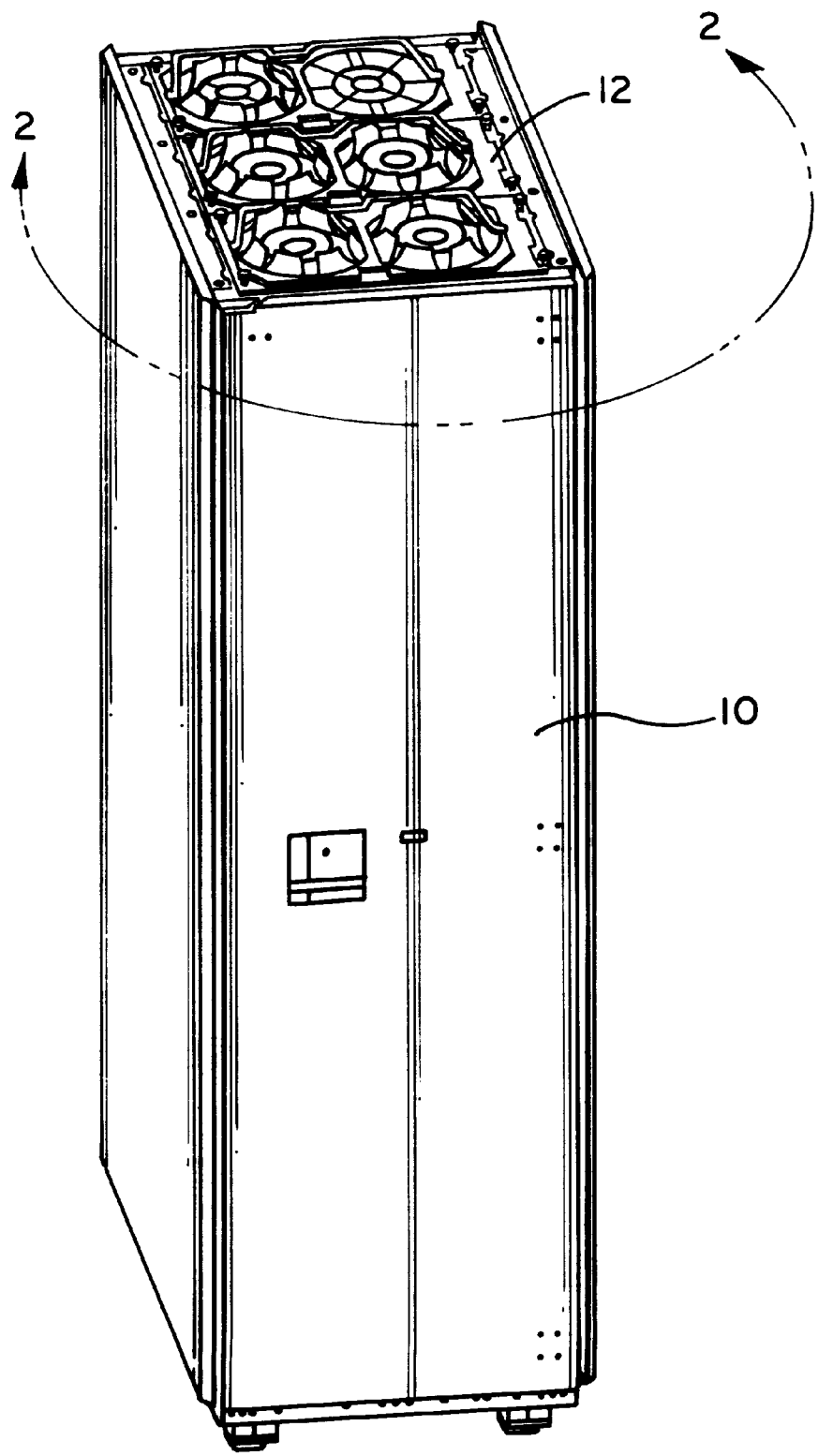
FIG. 1 is an sketch of an electrical cabinet according to the invention, such sketch shown six fans mounted to a top surface of the cabinet, all but the top right-hand fan being depicted in a properly operating condition.
Figure 2:
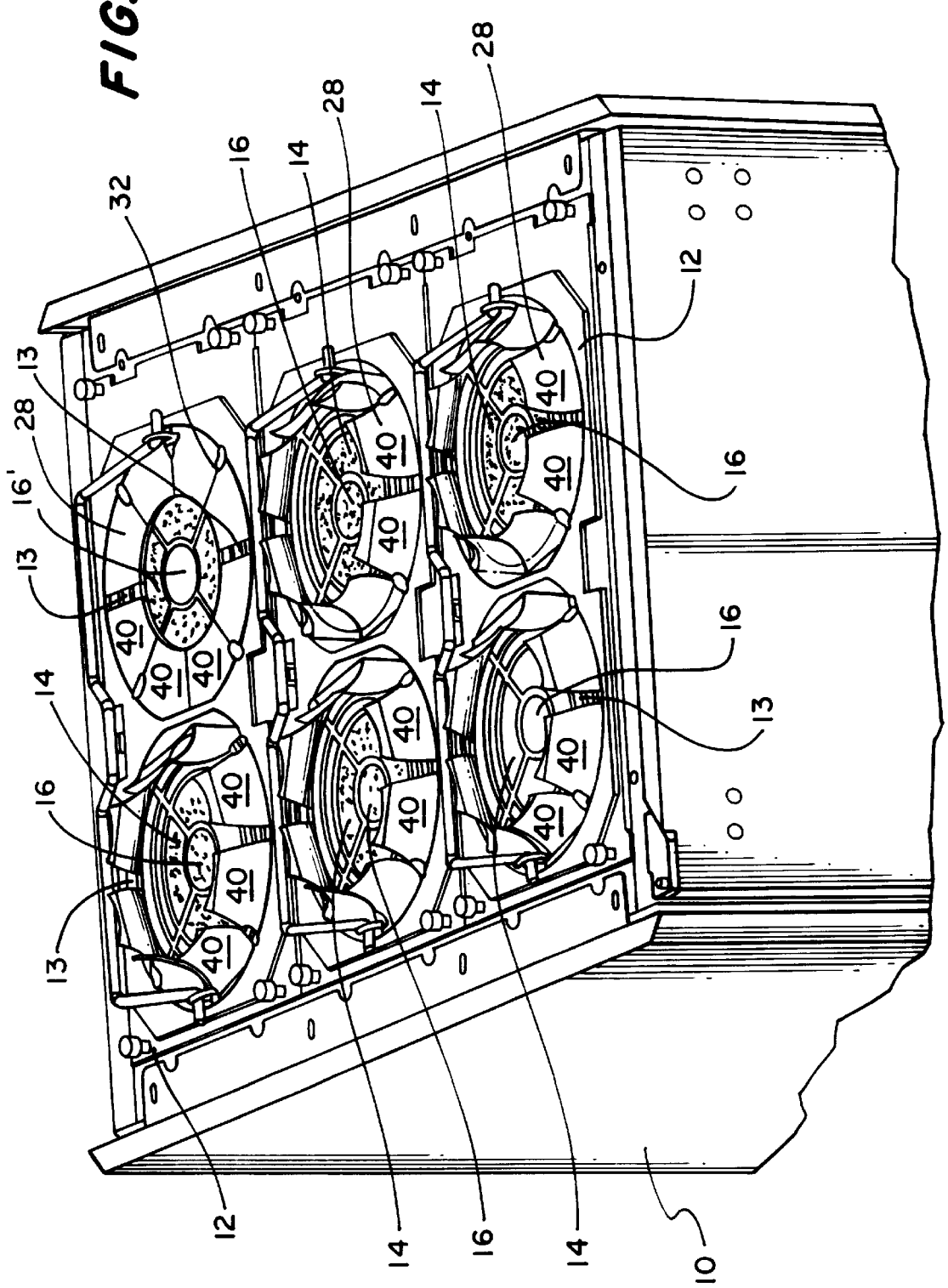
FIG. 2 is an enlarged top portion of the cabinet of FIG. 1, such portion being shown encircled by the circle labeled 2—2 in FIG. 1.

Referring now to FIGS. 1 and 2, a cabinet 10 is shown. The cabinet 10 has a plurality of compartments, not shown, disposed in an interior of the cabinet 10. The interior is configured to house electrical components, not shown. A surface, here a top surface 12, of the cabinet 10 has a plurality of apertures 14 formed therethrough. A plurality of circular-shaped fans 16 are mounted in registration with a corresponding one of said plurality of apertures 14. Here the fans 16 are part of a tube axial fan assembly. Here there are three fan assemblies, an exemplary one thereof being shown in detail in FIG. 4. It is noted that the fan assembly has a pair of fans 16. The fans each have central hubs 15, here shown stippled, to which is mounted the fan motor 19, as shown in FIGS. 5A and 5B, and a shield, or grate 17 for preventing accidental insertion of a finger into the fan 16. A plurality of struts 13 support the hubs 15 to an outer support frame, not shown, of the fan. Here, two struts are shown for each hub 15. Air passes through the grate 17 when the fan 16 is operating properly as shown in FIG. 5B and as shown more clearly for the right-hand fan 16 in FIG. 4. Thus, the grate 17 is disposed about the periphery of the hub 15 through which air, represented by the arrows in FIG. 5B, passes when the fan 16 is operating. It is noted that air does not pass through the hub 15, but only through the grate 17, as shown in FIG. 5B.

Referring again also to FIGS. 1 and 2, each one of the fans 16 is adapted to produce a flow of air through the interior of the cabinet 10 when operating properly to exhaust such flow of air externally of the cabinet.

Figure 3:
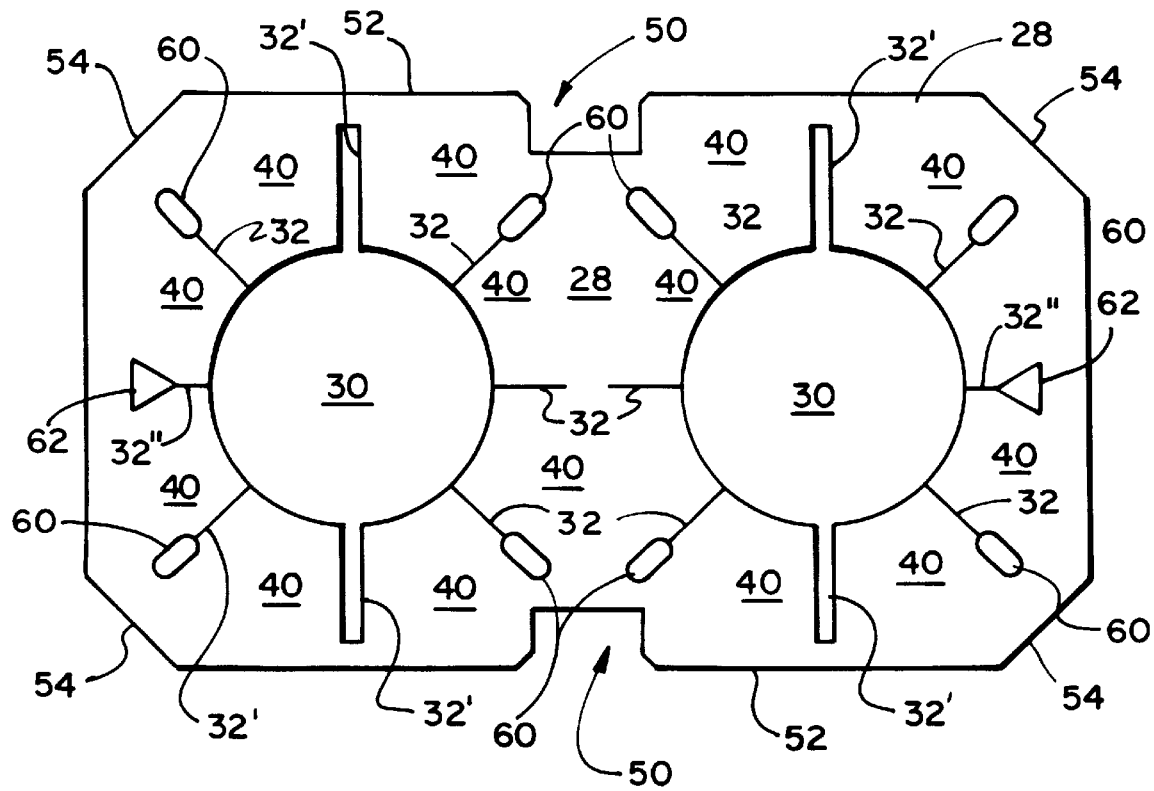
FIG. 3 is a plan view of a resilient membrane used on the top portion of the cabinet of FIG. 1.

A plurality of, here 3, resilient membranes 28 are mounted to the top surface 12 of the cabinet 10. Each one of the resilient membranes 28 is identical in construction. An exemplary one thereof is shown in FIG. 3. The resilient membrane 28 has a plurality of, here 2, circular-shaped apertures 30 formed therein. Each one of the apertures 30 is disposed in registration with an associated one of the fans 16 and the one of the apertures 14 in the top surface 12 corresponding to such one of the fans 16.

Disposed about the periphery of each one of the apertures 30 are a plurality of spaced slits 32 extending radially from the center of such one of the circular shaped-apertures. The slits 32 form a plurality of circularly spaced flaps 40 in the resilient membrane 28. The flaps 40 are configured to pivot outwardly from the top surface 12 from the force of the flow of air passing through the aperture 14 in the cabinet 10 in registration therewith when the fan 16 associated therewith is operating properly, as shown in FIG. 2 for all the fans 16 except for the fan 16' shown in the upper right hand corner where the fan 16' is here in a non-operating condition. See also FIG. 4, where the left-hand fan is non-operating and the right-hand fan is operating.

More particularly, referring to FIG. 2, an example is shown when here five fans 16 are operating properly, as can be detected by the fact that the flaps 40 extend outwardly, here upwardly from the surface of the cabinet 10; while, the fact that fan 16' is not operating properly, may be visually detected because the flaps 40 associated with non-operating fan 16' are closed.

Here, the resilient membrane 28 (FIG. 3) is a 0.013" thick, silicon coated fiberglass fabric material. Here, the for the particular top surface of the cabinet 10, membrane 28 is rectangularly shaped, with an indent 50 half way down each of the long sides 52 of the membrane 28. The resilient flexible membrane 28 has corners 54 chamfered at a forty five degree angle. The resilient flexible membrane 28 has the pair of apertures 30 formed therethrough, as indicated. The aperture 30 are here circular in shape, is slightly smaller than the hub 15 as shown in FIG. 5A causing the membrane 28 to overlap the hub 15. The slits 32 terminate in elliptical apertures 60 in the resilient membrane 28. The elliptical apertures 60 have their major axes co-linear with an associated slit 32. It is noted that slits 32' are relatively wider than the other slits 32 to accommodate a strut 13; the width of the slits 32' being narrower than the width of the overlying strut 13. Further, slits 32" terminate in a triangular shaped aperture 62. It is also noted that the aperture 30 is sized to overlap the hub 15 (FIG. 4) of the fan 16 while the flaps 40 are configured to, in the closed position shown for the right-hand fan in FIG. 4, cover, for the most part, the grate 17, and struts 13.

Here, air flow for cooling the electrical components is evacuated through the cabinet 10 from bottom to top. As noted above, the resilient membrane 28 is placed over the exhaust side of the tube axial fan assembly, FIG. 4) to act as a one-way air check valve. The mass momentum of the air causes the check valve material (i.e., the flaps 40) to deflect and open a path for the air to escape, as shown in FIG. 5B. The air can continue to exhaust from the fan 16 while the fan 16 is operating, but if the fan 16 fails, as in the case of fan 16' in FIGS. 1, 2, and 4, stops operating, the check valve (i.e., flaps 40) will collapse and seal over the fan grate 17 and inhibit, e.g., substantially prevent) air leakage into the cabinet 10, as shown in FIG. 5A. The inlet side of the fans 16, when operating, create a vacuum pressure inside the cabinet 10 of, here approximately 0.6 inches of water column. Air from outside the cabinet 10, being at atmospheric pressure, will be drawn to the low pressure in the event of a fan failure, and "push" the check valve (i.e., the flaps 40) associated with the non-operating fan 16' shown in FIGS. 1, 2, and 4 in the closed position indicated. During normal power down of the fans, the check valve material of membrane 28 has memory and will return to it's normally closed position.

The design of the fabric and check valve formed by the membrane 28 is such that it does not contribute to additional acoustic noise, nor does it flutter excessively in the turbulence. The fabric is both stiff to prevent flutter and pliable to deflect and minimize airflow restriction. The fabric is also strong and durable to prevent fraying and fatigue. The fabric is also somewhat compliant to conform to a non-flat surface during compression from an external retaining plate clamp load.

Figure 4:
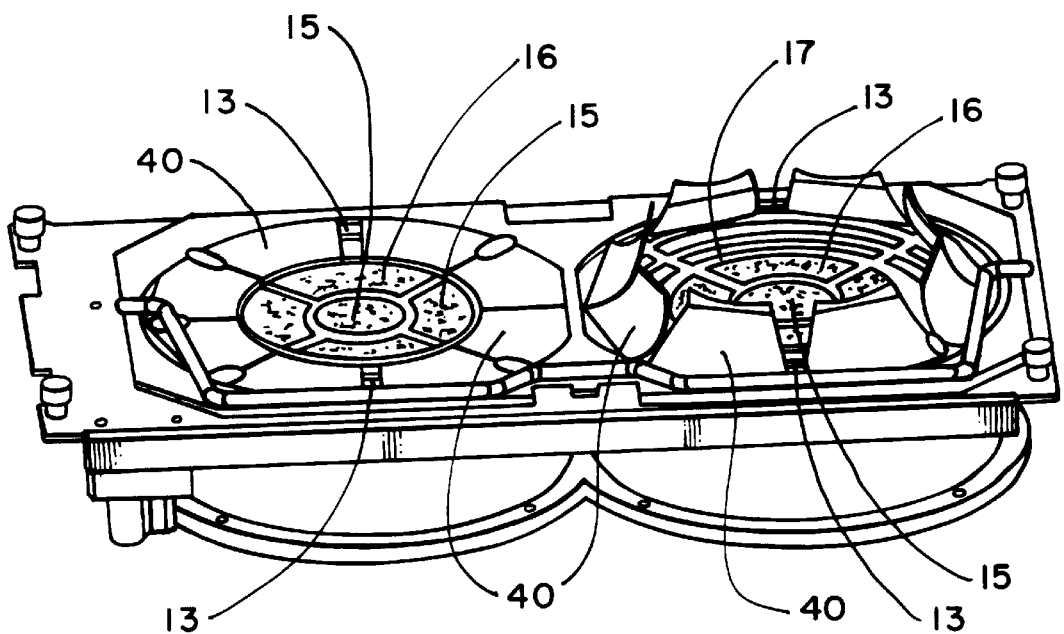
FIG. 4 is a sketch showing the resilient membrane of FIG. 3 mounted to a fan assembly of the cabinet of FIG. 1, such fan assembly having a pair of fans, the left-hand one thereof being shown in a non-operating condition and the right-hand one thereof being shown in a properly operating condition.
Figure 5A:
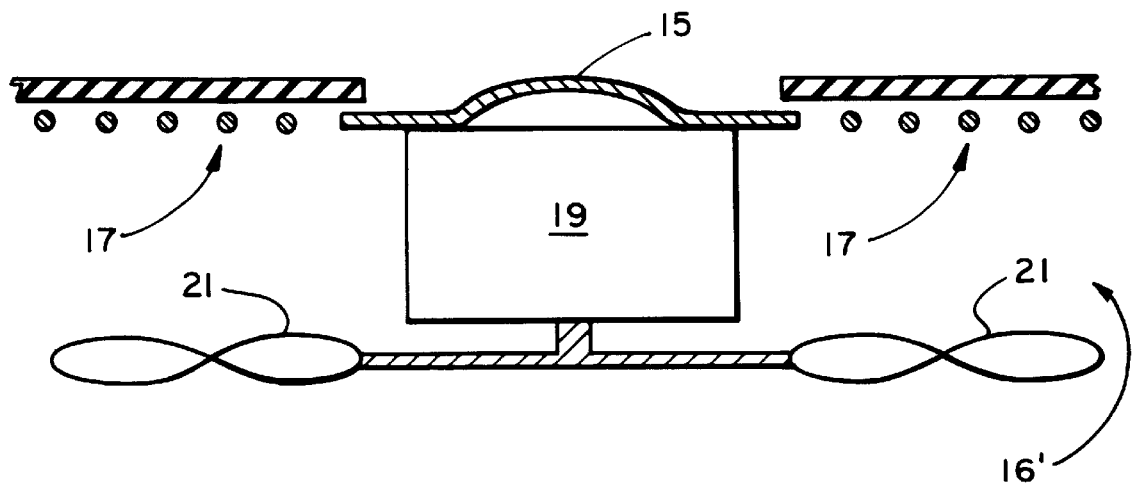
FIGS. 5A and 5B are diagrammatical sketches of a fan operating improperly with the membrane in a closed position and the fan operating properly with the membrane in the open position.
Figure 5B:
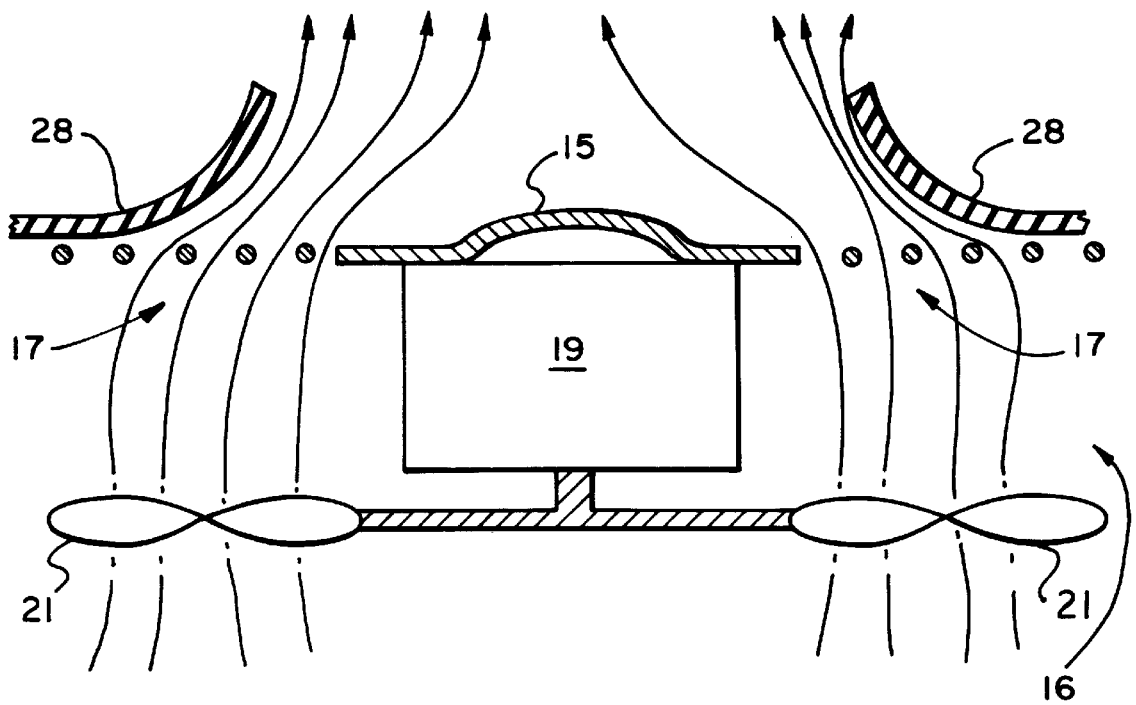

The check valve design has an inner diameter cut-out that extends slightly beyond the profile of the fan hub 15, as shown in FIGS. 4 and 5A. In the closed position, the check valve flap forms a loose seal from the outer diameter of the fan to the fan hub 15, as discussed above in connection with FIGS. 4 and 5A. With the radial cuts of the flap and the inner diameter cut-out, the profile or length of the flap during operation is lower. The lower profile reduces the air drag and losses as well as allowing for a less obtrusive visual profile.

The check valve can be mounted to the fan module tray using the same fasteners as the fan and an external retaining plate to provide distributed compression along the check valve length. The check valve can be mounted to open either radial inward or outward. The check valve can be designed to go over the struts of finger-protecting grate, with the finger guards preventing the fabric from entering the fan blade area.

Other embodiments are within the spirit and scope of the appended claims.

What is claimed is:

1. A cabinet, comprising:

a compartment disposed in an interior of the cabinet, such interior being configured to house electrical components, such cabinet having an aperture passing through a surface thereof;

a fan mounted to the surface of the cabinet over the aperture in the cabinet, such fan being adapted to produce a flow of air through the interior of the cabinet when operating properly to exhaust such flow of air externally of the cabinet;

a resilient membrane mounted to said surface of said cabinet over such fan, such resilient membrane having formed therein:

a plurality of slits extending radially from a center of a region of the membrane, such slits being spaced about the periphery of the aperture to form a plurality of flaps about the periphery of the region, such flaps being formed to pivot from a nominal position outwardly externally from the surface of the cabinet from the flow of air produced by the fan when the fan is operating properly and to return to the nominal position when the fan is operating improperly to inhibit air externally of the cabinet from entering into the interior.

2. The cabinet recited in claims 1 wherein the fan has a hub and a grate and wherein the membrane has an aperture formed therein, such aperture in the membrane being at the center of the region, the aperture in the membrane being disposed over the hub and the flaps being disposed over the grate when the fan is operating improperly.

* * * * *